United States Patent
Ottinger

(10) Patent No.: US 6,553,467 B1
(45) Date of Patent: Apr. 22, 2003

(54) BANK INFORMATION PRE-DECODE APPARATUS

(75) Inventor: James M. Ottinger, Duluth, GA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/909,809

(22) Filed: Aug. 12, 1997

(51) Int. Cl.[7] .............................................. G06F 12/00
(52) U.S. Cl. ...................... 711/156; 711/169; 711/154; 711/105
(58) Field of Search ................................. 711/170, 172, 711/154, 158, 105, 156, 169, 173

(56) References Cited

U.S. PATENT DOCUMENTS

| | | | | |
|---|---|---|---|---|
| 5,375,215 A | * | 12/1994 | Hanawa et al. ............... | 711/16 |
| 5,634,073 A | * | 5/1997 | Collins et al. ................. | 710/5 |
| 5,701,434 A | * | 12/1997 | Nakagawa ................... | 711/157 |
| 5,737,563 A | * | 4/1998 | Shigeeda ........................ | 711/5 |
| 5,745,913 A | * | 4/1998 | Pattin et al. ................. | 711/105 |
| 5,761,478 A | * | 6/1998 | Chen et al. .................. | 711/172 |
| 5,774,409 A | * | 6/1998 | Yamazaki et al. ...... | 365/230.03 |
| 5,822,772 A | * | 10/1998 | Chan et al. .................. | 711/158 |

* cited by examiner

*Primary Examiner*—John W. Cabeca
*Assistant Examiner*—Christopher S. Chow
(74) *Attorney, Agent, or Firm*—Blakely, Sokoloff, Taylor & Zafman LLP

(57) ABSTRACT

An apparatus for accelerating the speed of memory access cycles in a multi-bank memory. The apparatus includes decode logic that pre-decodes bank information from a requested address signal while the corresponding request is queued in the request queue. The pre-decode logic is propagated to the memory controller, preferably by re-insertion into the request queue, to facilitate more rapid memory accesses.

12 Claims, 2 Drawing Sheets

BANK INFORMATION PRE-DECODE APPARATUS

FIELD OF THE INVENTION

The present invention relates to high performance, high frequency memory controllers and, more specifically, to efficiently decoding address information therein.

BACKGROUND OF THE INVENTION

Typical prior art computer systems may require several system clock cycles to perform all of the necessary decode operations for a main memory (usually DRAM) access cycle.

One reason for the undesirable delay in performing a DRAM cycle is that common configurable memory modules such as SIMMs, DIMMs and the like may be of different sizes, requiring a different number of address bits and logic for processing the different number of address bits. This problem may exist whether the memory configuration is original or contains upgrades, and tends to be exacerbated in upgraded memory configurations. Another reason for undesirable decode delays is the requisite processing time of logic that supports a number of memory banks that is other than a power of two (2). Each of these addressing conditions increases the amount of time required for decoding address information for a DRAM cycle.

SUMMARY OF THE INVENTION

Accordingly, it is an object of the present invention to more efficiently decode address information (i.e., physical memory location) so as to require fewer clock cycles to complete a memory access cycle.

It is another object of the present invention to provide a memory controller that pre-decodes address information for a memory access cycle.

It is another object of the present invention to provide a memory controller that pre-decodes bank select information for a memory access cycle.

It is also an object of the present invention to provide a memory controller that pre-decodes bank select information for efficient paging.

These and related objects of the present invention are achieved by use of a bank information pre-decode apparatus as described and claimed herein. In one embodiment of the present invention the bank information pre-decode apparatus includes an address bus; a memory access request queue coupled to said address bus; a multi-bank memory and associated memory control logic coupled to said request queue; and decode logic coupled between said address bus and said memory that decodes bank information from a signal from said address bus; wherein said bank information is propagated to said memory control logic to facilitate a rapid memory access cycle. The bank information is preferably a bank select signal.

In further embodiments, the bank information is propagated through said request queue to said memory (said bank information being propagated from said decode logic to a corresponding request in said request queue), and said decode logic comprises comparator logic that compares the signal received from said address bus with a plurality of values that indicate address boundaries of banks in a multi-bank memory. The bank information may includes a plurality of bits, each bit indicative of one of the banks in said multi-bank memory. Memory paging logic may also be provided that receives said bank information at least when the request corresponding to that bank information is popped off said queue to said control logic and begins memory paging based on that bank information.

The attainment of the foregoing and related advantages and features of the invention should be more readily apparent to those skilled in the art, after review of the following more detailed description of the invention taken together with the drawings.

DETAILED DESCRIPTION

Figure 1:
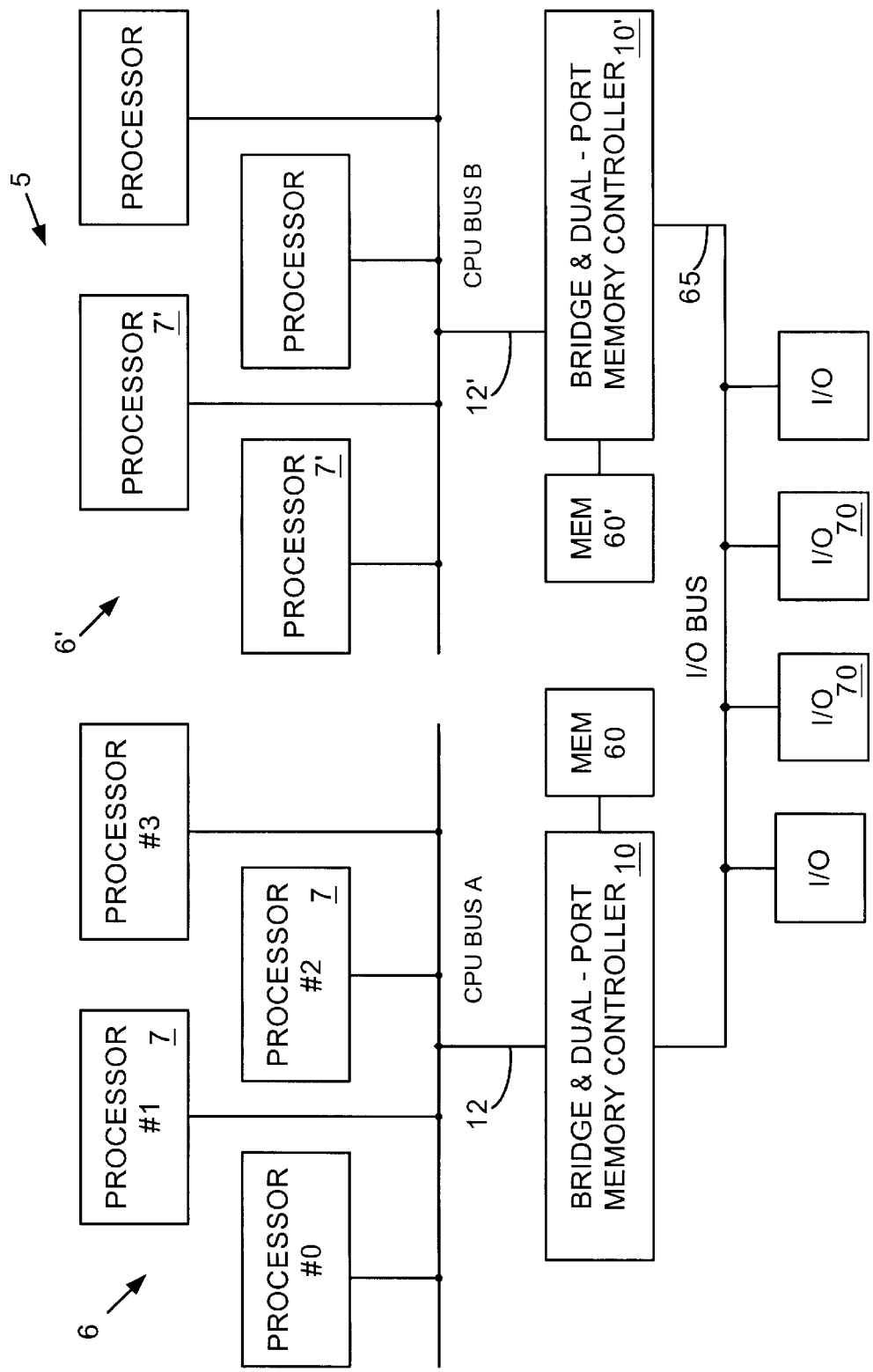
FIG. 1 is a block diagram of an exemplary computing system incorporating a memory controller in accordance with the present invention.

Referring to FIG. 1, a block diagram of an exemplary computing system incorporating a memory controller 10 in accordance with the present invention is shown. System 5 includes two processor clusters 6,6' and each cluster includes a plurality of processors 7,7' (4 in the illustrated embodiment). While the processors 7,7' may be almost any type of processor, the present invention is well suited for,use with the Intel family of microprocessors including the and Pentium Pro processors. The present invention is also well suited for use with the pipelined bus architecture often used with these types of processors.

Each of the processor clusters is coupled to a memory controller 10,10' by a processor bus 12,12' (for example, a processor bus), respectively. Each controller is coupled to main memory (i.e., local fast access memory) 60,60' and to a system or I/O bus 65 to which a plurality of representative input/output (I/O) devices 70 are connected. The fast access memory is preferably dynamic random access memory (DRAM), though it may include other types of random access memory and the like. This type of memory is commonly available on plug in boards such as SIMMs, and DIMMs. It should be recognized that the decode logic described herein is applicable to all memory where a pre-decode bank select or the like is beneficial to performance. I/O devices 70 typically include mass storage devices and may include network connections and any other type of data transmission or storage device.

Figure 2:
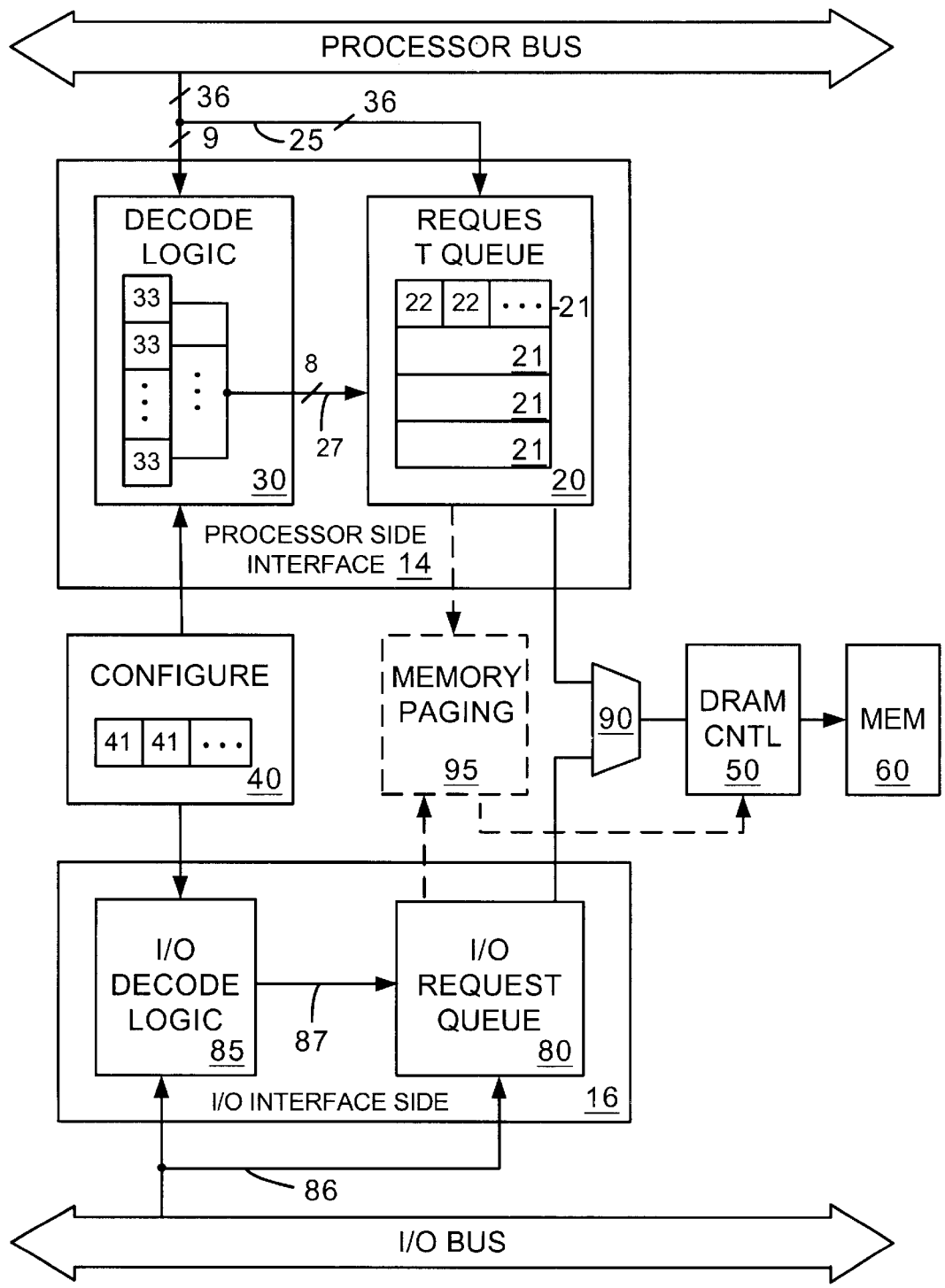
FIG. 2 is a block diagram of the memory controller of FIG. 1 in accordance with the present invention.

Referring to FIG. 2, a block diagram of a memory controller 10 of FIG. 1 in accordance with the present invention is shown. Memory controller 10' is preferably substantially the same as memory controller 10 and thus, the teachings which follow with respect to memory controller 10 are applicable to memory controller 10'.

Memory controller 10 manages control and data flow in all directions between the processor bus 12 and I/O bus 65. Memory controller 10 also controls access to local memory 60 which is preferably a coherent interleaved DRAM memory array.

Memory controller 10 preferably includes a processor side interface 14, an I/O side interface 16, and a dual ported DRAM controller 50. DRAM controllers are known in the art.

The processor side interface 14 includes a processor request queue 20 and bank select decode logic 30. Each of these components 20,30 is connected through address bus 25 to local bus 12.

Queue 20 contains a plurality of entries 21 (four in a preferred implementation discussed below) through which memory access requests are serially propagated until they are popped off to the DRAM controller 50. Each request (each entry 21) includes a plurality of fields 22 that contain requisite information for a memory access cycle.

The decode logic 30 receives the upper address bits of the memory address in a memory request. Through a series of comparisons discussed below, the decode logic selects the bank that the requested address is contained in. This bank is feed through line 27 to an appropriate field in the corresponding request in queue 20. Thus, when the request in queue 20 is popped off to controller 50, the bank select has already been completed elimination the extra clock cycles conventionally used by the DRAM controller to decode the appropriate bank.

Implementation

While the present invention may be implemented in many ways, the following is an illustrative example of one such implementation. The processor bus is 64 bits in width. Address bus 25 receives 36 bits (35:0) of which bits 35:3 are address bits and bits 2:0 are byte enable bits. In the event that memory 60 is 16 gigabyte (GB), the highest two address bits 35:34 are not used. The next highest nine address bits 33:25 are fed to decode logic 30.

Decode logic 30 consists of a plurality of comparators (or logical equivalents thereof) 33 which provide the following comparisons.

Bank Select Decode Comparisons

Bank_Sel(0)<=1 when base address<A<Limit0

Bank_Sel(1)<=1 when Limit0≦A<Limit1

Bank_Sel(2)<=1 when Limit1≦A<Limit2

Bank_Sel(3)<=1 when Limit2≦A<Limit3

Bank_Sel(4)<=1 when Limit3≦A<Limit4

Bank_Sel(5)<=1 when Limit4≦A<Limit5

Bank_Sel(6)<=1 when Limit5≦A<Limit6

Bank_Sel(7)<=1 when Limit6≦A<Limit7 The letter "A" represents the value of the 9 bits from address bus 25. The Base Address is typically 0 on CPU BUS A 12, and some value greater than or equal to the amount of memory in MEM 60 on CPU BUS B 60', for example 4 GB. LimitX specifies the upper physical address in bank X of memory 60. The LimitX values are preferably determined by BIOS during initial system memory configuration and stored in registers 41 within configuration block 40. Techniques for programming BIOS (Basic Input Output System) to identify LimitX values are generally known in the art. It should also be recognized that the determination and storage of LimitX values could be achieved in hardware using accepted design teachings and this implementation is contemplated by the present invention.

The decode logic 30 preferably outputs an 8 bit byte to the request queue. Each bit represents a different bank in memory 60 (assuming that there 8 banks in memory 60). By representing each bank with a singular dedicated bit, subsequent decodes at controller 50 are not required.

The I/O interface side 16 of memory controller 10 includes similar logic to that described above for processor interface side 14. The I/O side 16 preferably includes a similar request queue 80, bank select decode logic 85, address bus 86 and bank select line 87. A multiplexer 90 selects between local and remote access to DRAM controller 50. The control of multiplexer 90 is generally known in the art.

With respect to memory paging, the mapping of the processor bus address to DRAM bank address may be different with different bank sizes. This means that the memory paging logic 95 (shown in dashed lines apart from controller 50 yet often incorporated therein) cannot finish until the bank decode is complete. Since the present invention completes the bank decode before controller 50 pulls a request off queue 20 or queue 80, the comparison and row and column address generation logic can be performed immediately. This improves system performance.

Aspects of the above discussed circuitry/logic may be implemented with conventional hardware or in software. In a preferred embodiment, they are programmed into an application specific integrated circuit (ASIC) formed from a transistor array.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

What is claimed is:

1. An apparatus comprising:

an address bus;

a memory access request queue coupled to said address bus;

a multi-bank memory and associated memory control logic coupled to said request queue; and decode logic coupled between said address bus and said memory to pre-decode bank information from an address from said address bus, said bank information having a bit for each bank in said memory having one bit corresponding to the bank of said address set to a first state and the remaining bits of the bank information being set to a second state, wherein said bank information is propagated through said request queue to said memory. said bank information being propagated from said decode logic to a corresponding request in said request queue.

2. The apparatus of claim 1, wherein said bank information is a bank select signal.

3. The apparatus of claim 1, wherein said decode logic further comprises comparator logic that compares the signal received from said address bus with a plurality of values that indicate address boundaries of banks in a multi-bank memory.

4. The apparatus of claim 1, further comprising memory paging logic coupled to said decode logic and said memory control logic that receives said bank information at least when the request corresponding to that bank information is popped off said queue to said control logic and begins memory paging based on that bank information.

5. An apparatus comprising:

an address bus;

a memory access request queue coupled to said address bus;

decode logic coupled to said address bus and said request queue to pre-decode bank information from an address received from said address bus and to propagate said bank information to a corresponding request in said request queue, said bank information having a bit for each bank in said memory having one bit corresponding to the bank of said address set to a first state and the remaining bits of the bank information being set to a second state.

6. The apparatus of claim 5, wherein said decode logic further comprises comparator logic that compares the signal received from said address bus with a plurality of values that indicate address boundaries of banks in a multi-bank memory.

7. The apparatus of claim 5, wherein the received signal from said address bus includes the higher address bits on said address bus.

8. The apparatus of claim 5, wherein said bank information is a bank select signal.

9. The apparatus of claim 5, further comprising:

a second address bus;

a second memory access request queue coupled to said second address bus;

second decode logic coupled to said second address bus and said second request queue that pre-decodes second bank information from a signal received from said second address bus and propagates said second bank information to a corresponding request in said second request queue;

wherein said request queue and said second request queue are coupled to a multi-bank memory.

10. The apparatus of claim 5, further comprising a random access memory controller coupled to said memory.

11. The apparatus of claim 10, further comprising memory paging and row and column address generation logic coupled to said decode logic and said controller that receives said bank information at least when the request corresponding to that bank information is popped off said queue to said controller and begins memory paging based on that bank information.

12. An apparatus comprising:

a request queue to store plurality of entries, said queue having a beginning and an end;

an address bus coupled to said request queue;

logic coupled to at least a portion of said address bus to receive an address therefrom and to pre-decode bank select information from said address said logic to insert said bank select information in a corresponding request propagates from the beginning to the end of said queue, said bank information having a bit for each bank in said memory having one bit corresponding to the bank of said address set to a first state and the remaining bits of the bank information being set to a second state.

* * * * *